(12) United States Patent
Zhang et al.

(10) Patent No.: US 8,207,049 B1
(45) Date of Patent: *Jun. 26, 2012

(54) COPLANAR SOLAR CELL METAL CONTACT ANNEALING IN PLASMA ENHANCED CHEMICAL VAPOR DEPOSITION

(75) Inventors: Xiaobo Zhang, Arcadia, CA (US); Julie Hoskin, Santa Monica, CA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/100,576

(22) Filed: May 4, 2011

Related U.S. Application Data

(62) Division of application No. 12/199,382, filed on Aug. 27, 2008, now Pat. No. 8,030,206.

(51) Int. Cl.
*H01L 21/00* (2006.01)
(52) U.S. Cl. .... 438/485; 438/57; 438/680; 257/E24.127
(58) Field of Classification Search .................. 438/680, 438/57, 485; 257/E24.127
See application file for complete search history.

(56) References Cited

U.S. PATENT DOCUMENTS

| | | | |
|---|---|---|---|
| 4,249,959 A | 2/1981 | Jebens | |
| 4,322,571 A | 3/1982 | Stanbery | |
| 4,450,033 A | 5/1984 | Little | |
| 6,709,947 B1 * | 3/2004 | Wrschka et al. | 438/398 |
| 6,927,179 B2 * | 8/2005 | DeBoer et al. | 438/778 |
| 6,974,768 B1 | 12/2005 | Kailasam | |
| 7,285,720 B2 | 10/2007 | Kukulka et al. | |
| 7,339,109 B2 | 3/2008 | Stan et al. | |
| 7,377,836 B1 | 5/2008 | Molnar | |
| 2007/0137697 A1 | 6/2007 | Kempa et al. | |
| 2007/0175507 A1 | 8/2007 | Dutta | |
| 2007/0235074 A1 | 10/2007 | Henley et al. | |
| 2008/0149177 A1 | 6/2008 | Stan et al. | |

OTHER PUBLICATIONS

Danzilio, D.; Overview of EMCORE's Multi-Junction Solar Cell Technology and High Volume Manufacturing Capabilities; CS MANTECH Conference; May 14-17, 2007; Austin, TX; pp. 11-14.
Kerschaver, E.; Back-Contact Solar Cells: A Review; Progress in Photovoltaics: Research and Applications; Dec. 2005; pp. 107-123.
Sherif, R. et al.; High Performance, Low-Cost III-V Concentrator Module; Spectrolab Inc.; pp. 261-262.
Sherif, R. et al.; High Performance, Low-Cost III-V Concentrator Module; Spectrolab Inc.; National Center for Photovoltaic Program Review Meeting, Oct. 14-17, 2001; Lakewood, CO, US; pp. 261-262.
Sherif, R. et al.; High Performance, Low-Cost III-V Concentrator Module; Spectrolab Inc.; National Center for Photovoltaic Program Review Meeting, Oct. 14-17, 2011; Lakewood, CO, US; pp. 261-262.

\* cited by examiner

*Primary Examiner* — Jarrett Stark
*Assistant Examiner* — Nicholas Tobergte
(74) *Attorney, Agent, or Firm* — Armstrong Teasdale LLP

(57) ABSTRACT

A solar cell fabrication process is described that includes etching a cap layer into a front surface of a semiconductor structure, depositing an anti-reflective coating onto the front surface of the semiconductor structure, forming a front electrical contact on the front surface of the semiconductor structure, forming a first back metal contact on a back surface of the semiconductor structure, utilizing a plasma enhanced chemical vapor deposition (PECVD) process to apply a dielectric layer to the first back metal contact, the PECVD process performed at within a temperature environment and for a duration that allows for the annealing of metal associated with the front electrical contact and the first back metal contact, and attaching at least one secondary electrical contact to the dielectric layer.

10 Claims, 3 Drawing Sheets

COPLANAR SOLAR CELL METAL CONTACT ANNEALING IN PLASMA ENHANCED CHEMICAL VAPOR DEPOSITION

CROSS-REFERENCE TO RELATED APPLICATIONS

This application is a divisional application of U.S. patent application Ser. No. 12/199,382 which was filed on Aug. 27, 2008 now U.S. Pat. No. 8,030,206.

BACKGROUND

The field of the disclosure relates generally to fabrication of wafers utilized as solar cells, and more specifically to coplanar solar cell metal contact annealing in plasma enhanced chemical vapor deposition.

A solar cell generally includes an active semiconductor structure including two semiconductor layers in facing contact with each other at a semiconductor junction. When illuminated by the sun or otherwise, the solar cell produces a voltage between the semiconductor layers and thence between a front side and a back side of the active semiconductor structure. As utilized herein, "front side" refers to the side facing toward the sun, and "back side" refers to the side facing away from the sun. Advanced solar cells may include more than two semiconductor layers and their respective semiconductor junctions. The various pairs of semiconductor layers of the advanced solar cells are tuned to the various spectral components of the sun to maximize the power output of the solar cell.

Electrical contacts are applied to both the front side and to the back side of the solar cell. In known solar cells, the back electrical contact is generally is a continuous electrically conductive layer deposited across all or most of the entire back side of the active semiconductor structure, inasmuch as the back side faces away from the sun during service. The front electrical contact normally includes a plurality of interconnected current-gathering strips deposited upon the front side of the active semiconductor structure. At discrete locations, attachment pad regions are defined on the strips so that external electrical leads may be affixed to the front electrical contact.

Many such solar cells are electrically connected together to make a module. The conventional way of interconnecting cells is by soldering highly conductive tabs to the front and rear of neighboring cells. If all the interconnection circuitry is moved to the rear of the module, it allows for an optimized module efficiency through a corresponding increase in the packing density of the cells. One way to form the above mentioned rear circuitry is to make the solar cells co-planar. In a co-planar solar cell both "front" and back contact pads are formed on the backside of the solar cell. The two contact pads are generally insulated from one another utilizing a dielectric layer.

Solar cells are used in space and terrestrial applications. Particularly for space applications where the solar cells may be inaccessible for many years, and go through many thousands of sunlight/shade (i.e., heating/cooling) duty cycles without any maintenance, the solar cells must be highly reliable. If the structure and performance of any element of the solar cell degrade during service, the power output of that solar cell may be permanently reduced and eventually lost.

Operable solar cells are known, but there is an ongoing need for an approach to increase the reliability of existing types of solar cells and to achieve high reliability in future types of solar cells. The fabrication process is one area where changes can be made to provide the above mentioned increase in reliability.

The dielectric layer in multiple junction co-planar solar cells is required to be robust and the processing of the dielectric layer during the fabrication process is generally done at a temperature that does not exceed 400° C. When the temperature exceeds 400° C. during the fabrication process, the multiple junction semiconductor material may be degraded, or the electrical resistance between metal contacts and semiconductor material may be increased. One process for fabricating the dielectric layer, is to apply a dielectric film through a plasma enhanced chemical vapor deposition (PECVD) process. A dielectric film fabricated utilizing the PECVD process results in a good insulator with low stress and typically without pinholes in the film. On the other hand, to anneal the metal contacts for low electrical resistance between semiconductor material and the metal contacts, exposure to a temperature approximate 400° C., for a duration of between ten and fifteen minutes is generally utilized.

In the fabrication of multiple junction co-planar solar cells, metal contact annealing and plasma enhanced chemical vapor deposition (PECVD) are two separate process steps. The deposition temperature used in PECVD, which follows the metal contact annealing step, is significantly lower than the temperatures encountered during the annealing step, to avoid over annealing of the metal contacts. The lower temperature for PECVD is not optimum. To that end, it is believed that a higher dielectric film electrical isolation yield is obtainable through an optimized PECVD temperature, which is elevated from temperatures currently used in the PECVD process. It follows that there is an unfulfilled need for a process that avoids metal contact over annealing without lowing the PECVD temperature, and that such a process would result in a higher dielectric film electrical isolation yield.

BRIEF SUMMARY

In one aspect, a solar cell fabrication process is provided. The process includes etching a cap layer into a front surface of a semiconductor structure, depositing an anti-reflective coating onto the front surface of the semiconductor structure, forming a front electrical contact on the front surface of the semiconductor structure, forming a first back metal contact on a back surface of the semiconductor structure, utilizing a plasma enhanced chemical vapor deposition (PECVD) process to apply a dielectric layer to the first back metal contact, the PECVD process performed at within a temperature environment and for a duration that allows for the annealing of metal associated with the front electrical contact and the first back metal contact, and attaching at least one secondary electrical contact to the dielectric layer In another aspect, a solar cell is provided that includes a semiconductor structure comprising a front surface and a back surface, a front electrical contact on the front surface, a first back metal contact on the back surface, a dielectric layer deposited onto the first back metal contact, and at least one secondary electrical contact attached to the dielectric layer. The dielectric layer is deposited utilizing a plasma enhanced chemical vapor deposition (PECVD) process performed at a temperature and for a duration that allows annealing of the front electrical contact and the first back metal contact to the semiconductor structure.

In still another aspect, a deposition process is provided that includes loading a semiconductor structure having a metal contact thereon into a deposition chamber maintained at a predefined temperature, starting dielectric film deposition onto the metal contact within a predefined time after loading the semiconductor structure into the chamber, and controlling the rate of deposition such that the duration of the deposition of the dielectric film corresponds with an annealing time associated with the metal contact and the semiconductor structure.

DETAILED DESCRIPTION

The present disclosure relates to solar cells and methods for their fabrication. Generally, solar cells include an active semiconductor structure having an active semiconductor structure front side and an active semiconductor structure back side. The solar cell active semiconductor structure may be of any operable type, but current configurations generally include a doped silicon layer and/or a doped gallium arsenide layer. For advanced solar cells that incorporate multiple semiconductor layers, there are different pairs of active semiconductor layers that are responsive to different wavelength components of the solar spectrum. The solar cell active semiconductor structure produces a voltage between the active semiconductor structure front side and the active semiconductor structure back side when illuminated. A back electrical contact overlies and contacts the active semiconductor structure back side. A front electrical contact overlies and contacts the active semiconductor structure front side.

In one known configuration, the front electrical contact has multiple layers comprising a titanium layer overlying and contacting the active semiconductor structure front side, a diffusion layer overlying and contacting the titanium layer, a barrier layer overlying and contacting the diffusion layer, and a joining layer overlying and contacting the barrier layer. The diffusion layer is preferably gold, but other metals such as palladium may be used in some circumstances. The barrier layer is preferably platinum, but nickel, palladium, rhodium, or other noble metals, may be used in some circumstances. The joining layer is preferably silver, but other metals such as gold, aluminum, or copper may be used in some circumstances.

Figure 1:
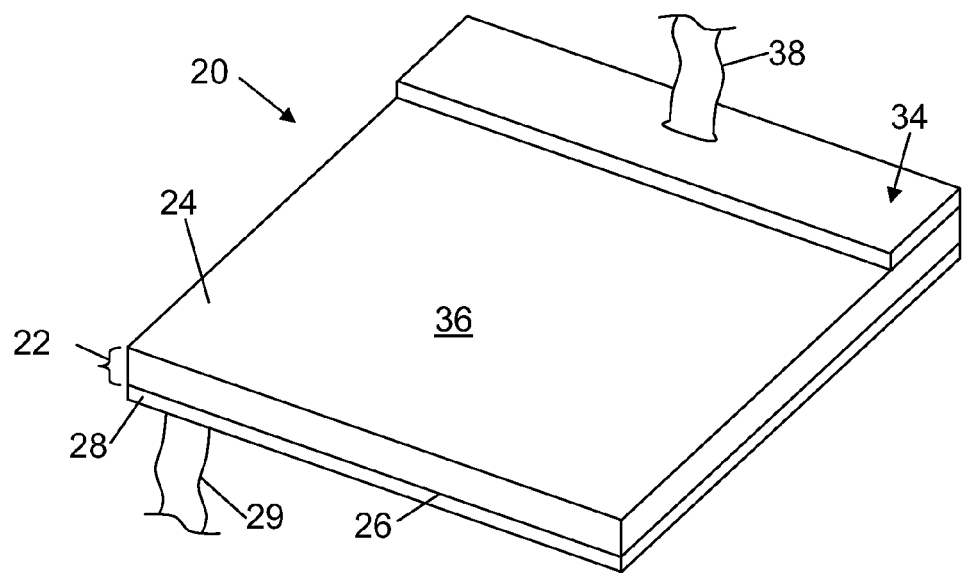
FIG. 1 is a diagram illustrating components of a solar cell.

FIG. 1 is a schematic diagram that generally illustrates the components of a solar cell 20. The solar cell 20 includes an active semiconductor structure 22 having an active semiconductor structure front side 24 and an active semiconductor structure back side 26. A back electrical contact 28, illustrated as a thin metallic layer, overlies and contacts the active semiconductor structure back side 26. The back electrical contact 28 usually covers the entire active semiconductor structure back side 26, though other configurations are known. A back electrical lead 29 is affixed to the back electrical contact 28. Likewise, a front electrical contact 34, also illustrated as a thin metallic layer, overlies and contacts a portion of the active semiconductor structure front side 24, resulting in an area 36 which can be impinged by light, thus operating the solar cell 20. A front electrical lead 38 is affixed to the front electrical contact 34.

When the solar cell active semiconductor structure 22, area 36, is illuminated by the sun or other light source directed against the active semiconductor structure front side 24, there is a voltage produced between the active semiconductor structure front side 24 and the active semiconductor structure back side 26.

Figure 2:
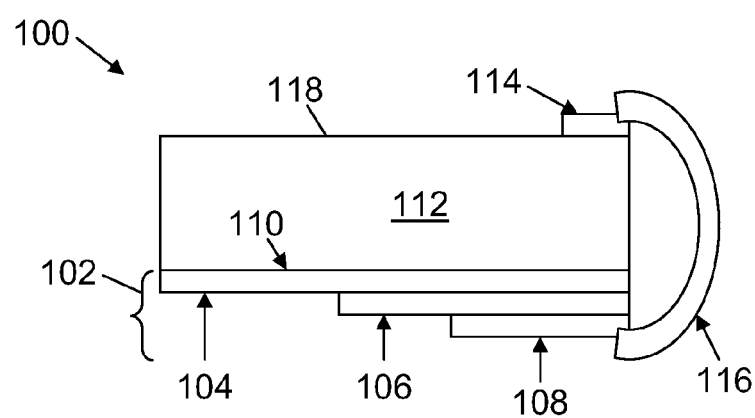
FIG. 2 is a cross-sectional view of a coplanar solar cell.

FIG. 2 is a cross-sectional view of a coplanar solar cell 100 that incorporates multiple back electrical contacts, one of which is electrically connected to a front electrical contact. The solar cell 100 includes a back electrical contact assembly 102 that is fabricated, in the illustrated embodiment, to include a first back metal layer 104 onto which is deposited a dielectric layer 106. A second back metal layer 108 is separated from the first back metal layer 104 by the dielectric layer 106. The back contact assembly 102 is attached to a back side 110 of semiconductor structure 112. In the illustrated embodiment, the second back metal layer 108 is connected to a front electrical contact 114 via an interconnection 116. The front electrical contact 114 is attached to a front side 118 of the semiconductor structure 112.

Figure 3:
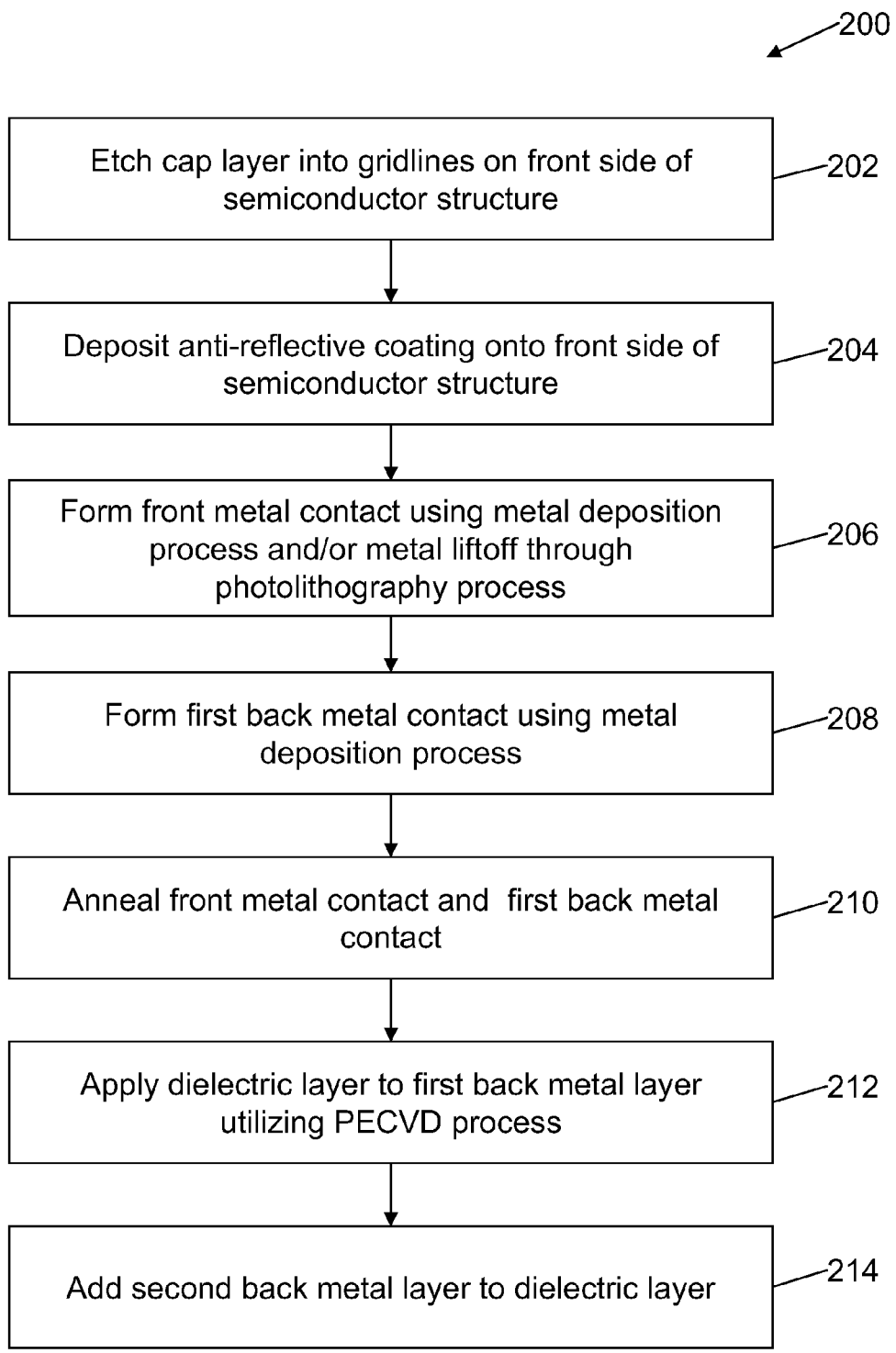
FIG. 3 is flowchart illustrating a portion of a solar cell fabrication process.

The solar cell 100 is fabricated from a semiconductor substrate wafer, semiconductor structure 112, that is processed using certain processes, for example, epitaxial deposition, etching processes, photolithography and metal deposition, to form the solar cell 100. FIG. 3 is a flowchart 200 that illustrates a currently utilized solar cell fabrication process. Specifically, the top epitaxial layer, sometimes referred to as a cap layer, is etched 202 into gridlines on the semiconductor structure 112 on which front electrical contact 114 is to be formed. An anti-reflective coating is then deposited 204 onto the front side 118 of semiconductor structure 112. One or both of a metal deposition process and a metal lift off through photolithography process are used to form 206 the front electrical contact 114. The first back metal layer 104 is formed 208 through a metal deposition process.

The first back metal layer 104, or electrical contact, and front metal contact 114 are annealed 210 such that the dielectric layer 106 can then be applied 212 using a plasma enhanced chemical vapor deposition (PECVD) process. The dielectric layer 106 can be either SiO2 or Si3N4. The second back metal layer 108, or secondary electrical contact, is then added 214 to the dielectric layer 106 and the dielectric layer 106 is patterned through wet chemical etching before the interconnection 116 between the front electrical contact 114 and the second back metal layer 108 is placed.

In the above described process, a deposition temperature environment associated with the PECVD process is lowered from the temperature environment utilized in the annealing process. The lowering of the PECVD process temperature prevents over annealing of the first back metal layer 104, or contact, and front electrical contact 114. However, the lower temperature is not in the optimum temperature range for the PECVD process, resulting in reduced quality of the dielectric layer 106. In one embodiment, the dielectric layer 106 is a film that is applied to the first back metal layer 104 through the PECVD process. More specifically, the annealing process temperature currently used in solar cell fabrication is about 400° C. and the PECVD process temperature currently used in solar cell fabrication is 350° C. or below. The optimized PECVD process temperature is about 400° C. However, continued processing at 400° C. leads to over annealing as described elsewhere herein.

Figure 4:
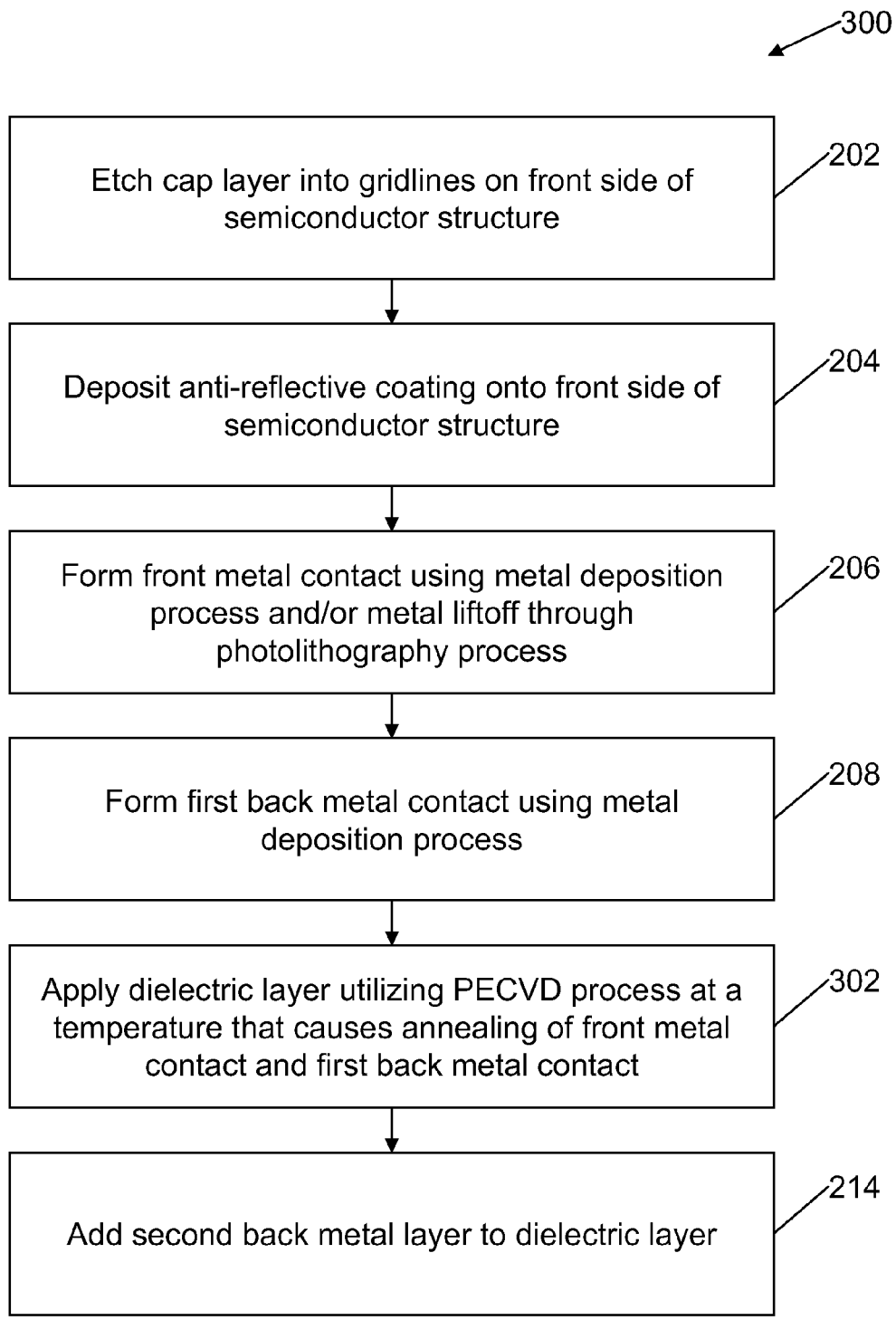
FIG. 4 is a flowchart illustrating a process combining metal contact annealing and plasma enhanced chemical vapor deposition (PECVD) processes into a single process.

FIG. 4 is a flowchart 300 illustrating a process whereby the metal contact annealing process and the plasma enhanced chemical vapor deposition (PECVD) process described above are combined into a single step, increasing an efficiency in the fabrication of coplanar solar cells such as the solar cell 100 illustrated in cross-section in FIG. 2. The steps in flowchart 300 that are common with steps in flowchart 200 are shown with the same reference numerals. The described process simplifies wafer production and improves yield through the combination of two separate processing steps into a single processing step. The process illustrated via FIG. 4 avoids the problems of metal contact over annealing described above without lowering the temperature of an environment where the PECVD application is performed. As a result, higher dielectric film electrical isolation yield is obtained due to the optimization of the PECVD temperature.

Now referring specifically to flowchart 300, in which the steps that are common with steps in flowchart 200 are shown with the same reference numerals, the cap layer is etched 202 into gridlines on the semiconductor structure 112 on which front electrical contact 114 is to be formed. An anti-reflective coating is then deposited 204 onto the front side 118 of semiconductor structure 112. One or both of a metal deposition process and a metal lift off through photolithography process are used to form 206 the front electrical contact 114. The first back metal layer 104 is formed 208 through a metal deposition process.

The wafers which have been processed to form front side contacts and the first back metal layer are loaded into a PECVD chamber for the dielectric film deposition. Once the wafers are transported into the PECVD chamber, which is maintained at a pre-set temperature of about 400° C., the dielectric film deposition process is started 302 within about ten seconds and is completed within ten to fifteen minutes. During the time of dielectric film deposition the front metal contact and back metal contact are both annealed to form an ohmic contact with the semiconductor material. A rate of deposition, which determines a deposition time for a fixed film thickness, can be adjusted to meet optimized metal contact annealing time. Upon the completion of the dielectric film deposition, the wafers are transported to a load lock chamber. The second back metal layer 108, or secondary electrical contact, is then added 214 to the dielectric layer 106 through photo lithography, metal deposition and metal lift off. The dielectric layer 106 is patterned through photolithography and wet chemical etching and the interconnection 116 between the front electrical contact 114 and the second back metal layer 108 is placed.

The process associated with flowchart 300 achieves simultaneous dielectric layer (film) deposition and metal contact anneal within a single PECVD process. It is known that a dielectric film becomes more dense and robust through PECVD deposition at elevated temperatures. Providing an optimized temperature range for the environment in which the PECVD process occurs results in a better dielectric film quality to improve production yield.

More specifically a metal contact, such as those utilized in the production of solar cells, requires an annealing temperature of about 400° C. for six to eighteen minutes in triple junction solar cell fabrication. One recommended deposition environment temperature for a PECVD process is about 400° C. For an effective electrical insulation the dielectric layer is between about three and six micrometers (μm) thick. The deposition time for such a film is from about ten to about fifteen minutes. However, if performing the metal contact annealing and PECVD processes separately, with both at their respective optimized temperatures and duration times, the wafer will be exposed to a longer than optimized metal contact annealing time. This increased exposure period will result in solar cell degradation that is observable in its performance. On the other hand, over annealing does not occur in the previously used process where the PECVD environment temperature is less than 350° C., and generally around 300° C., however the dielectric film quality is compromised. A combined annealing and PECVD process, performed at 400° C., as described herein, provides both optimized metal contact annealing condition (400° C. for between about ten to fifteen minutes) and an improved dielectric film for electrical isolation between the first back metal layer 104 and the second back metal layer 108.

This written description uses examples, including the best mode, to enable any person skilled in the art to practice the described embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A deposition process comprising:
   loading a semiconductor structure having a metal contact thereon into a deposition chamber maintained at a predefined temperature;
   starting dielectric film deposition onto the metal contact within a predefined time after loading the semiconductor structure into the chamber; and
   controlling the rate of deposition such that the duration of the deposition of the dielectric film corresponds with an annealing time associated with the metal contact and the semiconductor structure.

2. The deposition process of claim 1 wherein starting dielectric film deposition comprises utilizing a plasma enhanced chemical vapor deposition (PECVD) process.

3. The deposition process of claim 1 wherein the predefined temperature is about 400° C.

4. The deposition process of claim 3 wherein the duration of the deposition between about ten minutes and about fifteen minutes.

5. The deposition process of claim 3 wherein the predefined time for starting dielectric film deposition onto the metal contact is about ten seconds.

6. The deposition process of claim 1 wherein controlling the rate of deposition comprises controlling the rate of deposition such that the dielectric film deposition process is completed within ten to fifteen minutes.

7. The deposition process of claim 1 wherein the annealing time is the time needed to form:
   an ohmic contact between a front of the electrical contact and the semiconductor structure; and
   an ohmic contact between the metal contact and the semiconductor structure.

8. The deposition process of claim 1 further comprising attaching at least one secondary electrical contact to the deposited dielectric layer.

9. The deposition process of claim 8 wherein attaching at least one secondary electrical contact to the deposited dielectric layer comprises
   transporting the semiconductor structure to load lock chamber; and
   adding a second back metal layer to the dielectric film; and
   patterning the dielectric layer through at least one of photolithography and wet chemical etching.

10. The deposition process of claim 8 further comprising placing an interconnection between the metal contact and the secondary electrical contact.

* * * * *